(12) United States Patent
Trojan et al.

(10) Patent No.: US 6,368,183 B1
(45) Date of Patent: Apr. 9, 2002

(54) WAFER CLEANING APPARATUS AND ASSOCIATED WAFER PROCESSING METHODS

(75) Inventors: Daniel Trojan, Phoenix; Periya Gopalan, Chandler; Jon MacErnie, Gilbert, all of AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/493,851

(22) Filed: Jan. 28, 2000

Related U.S. Application Data

(60) Provisional application No. 60/118,361, filed on Feb. 3, 1999.

(51) Int. Cl.[7] .......................... B24B 49/00; B24B 51/00
(52) U.S. Cl. ............................ 451/8; 451/67; 451/332; 15/88.3; 134/902; 414/936
(58) Field of Search .................. 451/5, 8, 65, 67, 451/331, 332; 15/88.2, 88.3, 77; 134/32, 902; 414/757, 936, 941

(56) References Cited

U.S. PATENT DOCUMENTS

| | | |
|---|---|---|
| 5,144,711 A | 9/1992 | Gill, Jr. |
| 5,518,552 A | 5/1996 | Tanoue et al. |
| 5,581,837 A | 12/1996 | Uchiyama et al. |
| 5,624,501 A | 4/1997 | Gill, Jr. |
| 5,626,681 A | 5/1997 | Nakano et al. |
| 5,655,954 A | 8/1997 | Oishi et al. |
| 5,671,544 A | 9/1997 | Yokomizo et al. |
| 5,675,856 A | 10/1997 | Itzkowitz |
| 5,679,169 A | 10/1997 | Gonzales et al. |
| 5,693,148 A | 12/1997 | Simmons et al. |
| 5,723,019 A | 3/1998 | Krussel et al. |
| 5,727,332 A * | 3/1998 | Thrasher et al. ............... 34/277 |
| 5,809,832 A * | 9/1998 | Gockel et al. ............. 74/89.15 |
| 5,954,888 A * | 9/1999 | Gupta et al. .................... 134/3 |
| 6,149,498 A * | 11/2000 | van Kessel et al. ........... 451/28 |
| 6,200,201 B1 * | 3/2001 | Ravkin et al. ................ 451/65 |

FOREIGN PATENT DOCUMENTS

| | | |
|---|---|---|
| EP | 0 493 117 A2 | 12/1991 |
| WO | WO 92/16965 | 10/1992 |
| WO | WO 98/01892 | 1/1998 |
| WO | WO 98/06889 | 2/1998 |

* cited by examiner

Primary Examiner—Timothy V. Eley
(74) Attorney, Agent, or Firm—Snell & Wilmer, LLP

(57) ABSTRACT

Apparatus and method for cleaning, rinsing and drying work pieces such as semiconductor wafers. The apparatus can be combined, in an integrated apparatus, with a CMP machine. The apparatus includes one or more brush boxes with water tracks to convey work pieces to and from the brush boxes. Each brush box and its associated water track provide for the containment of cleaning agents such as HF used in the cleaning process so that different cleaning agents used in different brush boxes are kept segregated. The efficiency of the brush box is enhanced by providing for movement of work pieces back and forth through the brush box. Thus work pieces can make more than one pass through a brush box.

21 Claims, 12 Drawing Sheets

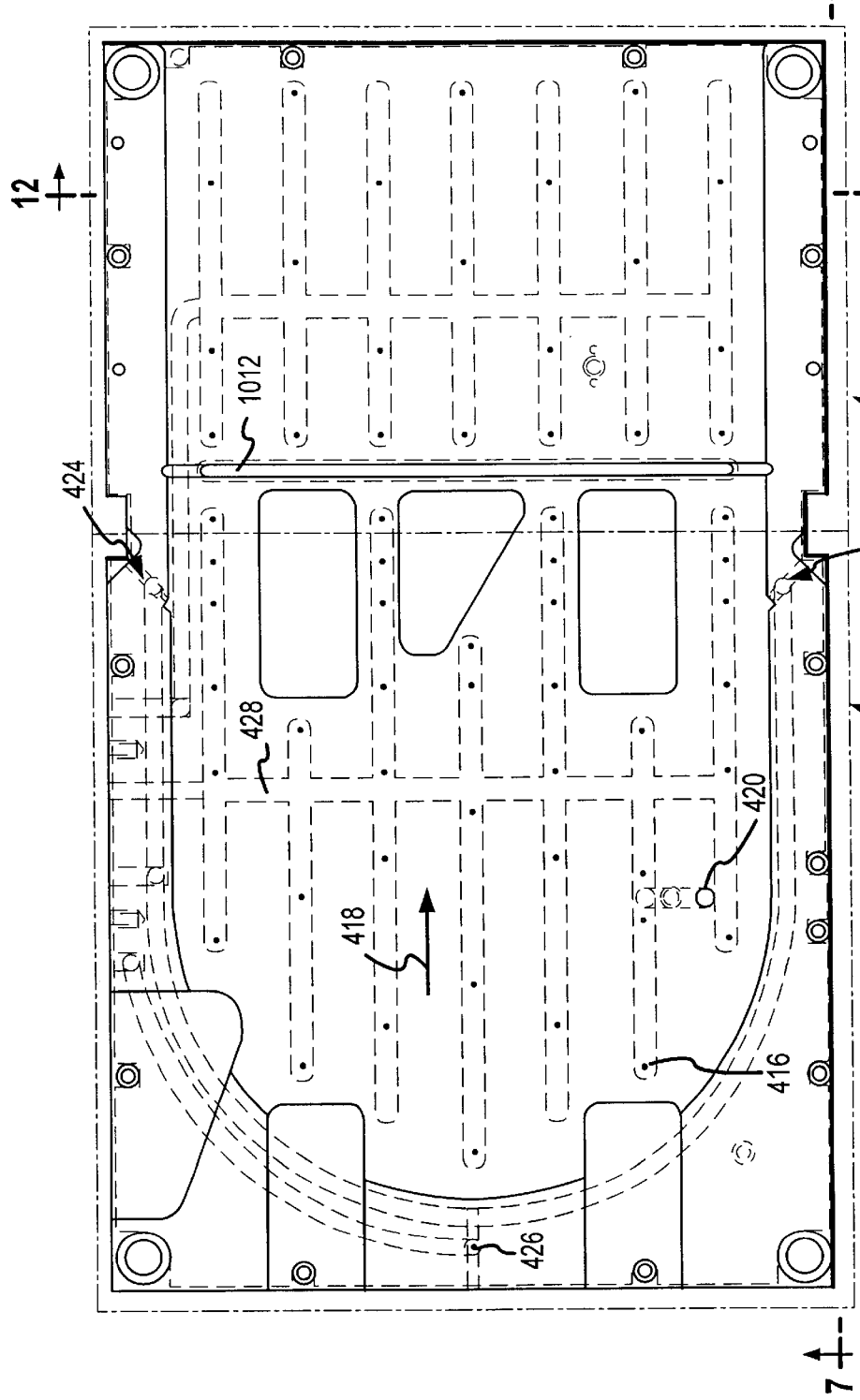
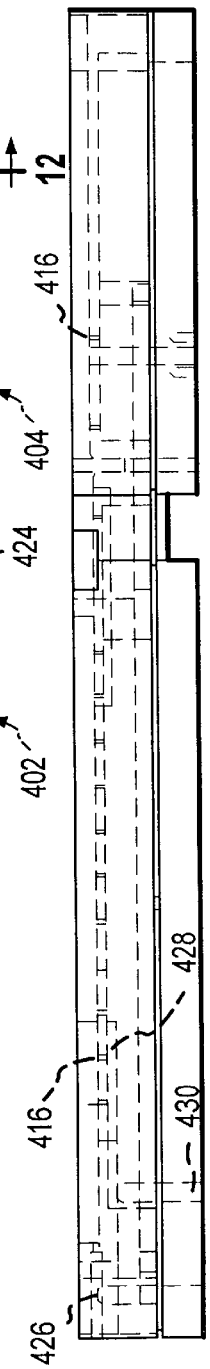
FIG.6
FIG.7

WAFER CLEANING APPARATUS AND ASSOCIATED WAFER PROCESSING METHODS

CROSS REFERENCE TO RELATED APPLICATION

This application claims priority from provisional application Ser. No. 60/118,361 filed Feb. 3, 1999.

FIELD OF THE INVENTION

The present invention relates, generally, to a self-contained machine and to a method associated with that machine for cleaning and rinsing work pieces and, more particularly, to an improved system and method for brush cleaning semiconductor wafers in the presence of various solutions and then rinsing the wafers.

BACKGROUND OF THE INVENTION

Machines for polishing and machines for cleaning work pieces and disks in the electronics industry are generally well known. For example, semiconductor wafers, magnetic disks, and other work pieces often come in the form of flat, substantially planar, circular disks. In the manufacture of integrated circuits, semiconductor wafer disks are sliced from a silicon ingot and prepared for further processing. After each wafer is sliced from the ingot, it must be thoroughly polished and then cleaned, rinsed, and dried to remove debris from the surface of the wafer. Thereafter, a series of steps are performed on the wafer to build the integrated circuits in and near the wafer surface, usually including the steps of depositing or otherwise forming one or more dielectric or metal layers overlying the wafer surface. Typically, after the layers are formed on the wafer surfaces, the wafers must be planarized to remove excess material and imperfections.

After each processing step, it is often desirable to thoroughly clean, rinse, and dry the wafers to ensure that debris is removed from the wafers. Thus, a method and apparatus for quickly and efficiently cleaning, rinsing, and drying wafers is needed which facilitates high wafer throughput, while at the same time thoroughly cleaning and drying the wafers with a minimum of wafer breakage. For a discussion of existing wafer cleaning machines, see, for example, Lutz, U.S. Pat. No. 5,442,828, issued Aug. 22, 1995; Frank et al., U.S. Pat. No. 5,213,451, issued May 25, 1993; and Onodera, U.S. Pat. No. 5,357,645, issued Oct. 25, 1994.

Presently chemical-mechanical polishing and/or planarization (CMP), one method for planarizing wafers, is performed by one machine and wafer cleaning and drying is performed by another, separate machine. After a processing layer (i.e., oxide, tungsten or the like) has been formed on the surface of the wafers, the dry wafers are planarized in a CMP polishing machine. The CMP machine planarizes the wafers by removing excess material, and then typically the wafers are rinsed and placed into a wet cassette. After polishing, residual particles still reside on the wafer's surface. If these particles dry on the wafer prior to cleaning, the microelectronic structures on the wafer may be corrupted. Therefore, it is extremely important to keep the wafers wet prior to final cleaning and drying of the wafers. From the CMP machine the wet cassette is hand carried to a separate post-CMP wafer cleaning and drying machine that is typically located somewhere near the CMP machine.

This conventional practice of utilizing separate machines for wafer polishing and for wafer cleaning and drying has serious drawbacks. First, wafer manufacturers must have personnel, equipment and facilities on hand to transport wafers in a wet environment from a CMP machine to a cleaning and drying machine. Second, having separate machines for polishing wafers and for cleaning wafers consumes a significant amount of clean room space which, as one skilled in the art will appreciate, is very expensive. Third, having two separate operating systems requires operators to become familiar with two different machines and two different sets of controls.

In addition, recent wafer cleaning techniques have incorporated the use of a certain chemical cleaning agents that are difficult and/or dangerous to handle, such as highly diluted hydrofluoric acid (HF) solution, for improved cleaning of semiconductor wafers, particularly for cleaning metallic ion residue from CMP planarization of the wafer surface. HF poses substantial health and safety risks, and thus great care must be taken when designing equipment that utilizes HF to ensure against undesired escape of HF contaminated fluid or fumes. Past HF cleaning operations have been designed around the conventional dip-tank style of wafer cleaning, wherein wafers are held vertically and are immersed in a tank into which fluids, including HF, may be introduced. In such dip tank style cleaners the motion of the wafer through the fluid, the reaction of the fluid with the wafer surface, and circulation of the fluid in the tank are relied upon to clean the wafer surface.

Conventional brush box style cleaners have also been modified to accommodate the use of HF solutions in wafer cleaning. Known HF brush box cleaners introduce HF solution onto the wafer or the brushes of the brush box so that the wafer is then mechanically scrubbed in the HF solution. Because of the extremely hazardous and corrosive nature of the HF, very dilute solutions are preferable for cleaning. As a result of using dilute solutions, the cleaning time is increased. To provide for adequate cleaning and particle removal, past HF cleaners have had to either add additional brush boxes to increase HF scrubbing time, or have had to increase the wafer residence time in the brush box. One way to increase the residence time is to move the wafer through a single brush box at a reduced rate. A problem with slowing the rate at which the wafer moves through the brush box is that it becomes difficult to control the wafer feed rate when the rate becomes too low. The residence time can also be increased by rotating the wafers within the brush box. Unfortunately this adds complexity to the equipment and results in nonuniformity in the cleaned wafer surface. Adding additional brush boxes or lengthening existing boxes is also often unsatisfactory because either solution requires additional scrubbing length which, in turn, increases the overall tool footprint. The added scrubbing length also increases the amount of chemicals used in the process. Thus a need exists for an improved brush box for cleaning semiconductor wafers or other work pieces with chemical cleaning agents such as HF that safely and efficiently scrubs the work piece in the presence of the chemical cleaning agents without overly slowing the work piece feed rate, or increasing tool footprint and with minimum chemical consumption. Ideally such a brush box and cleaning method could be incorporated into an integrated apparatus and method for CMP polishing, cleaning, rinsing, and drying of work pieces.

SUMMARY OF THE INVENTION

In accordance with one embodiment of the invention, cleaning apparatus preferably comprises a water track, cleaning stations, and a plurality of work piece staging areas.

In a further embodiment of the invention, the cleaning apparatus additionally includes a rinse station and a spin dryer station. In accordance with a preferred embodiment of the invention, the cleaning apparatus comprises an input water track station, a first scrub module, a mid-station water track, and a second scrub module. Each scrub module preferably includes a brush box and a rinse station and is chemically isolated from the other scrub module. Potentially hazardous chemical cleaning fluids are contained within each module using primary and secondary containment, and chemical fumes are exhausted from each module independently.

In accordance with a further embodiment of the invention, the cleaning apparatus is combined with a planarization apparatus to form a single, integrated machine for the planarization and cleaning of work pieces. More specifically, in accordance with a preferred embodiment, a work piece is planarized in a CMP station and then is directly transferred to a cleaning apparatus of the machine. When a work piece is first loaded into the cleaning apparatus from a CMP station of the machine, the work piece is held at a first input water track staging area until a determination is made that the next processing area, the first scrub module, is clear and is ready to receive the work piece. Only then is the work piece released to that next processing module. When cleared, water jets of the water track urge the work piece into the first brush box cleaning station (within the first scrub module) that is configured to scrub and clean both surfaces of the work piece in the presence of a first chemical cleaning agent that, in a preferred embodiment, may be a dilute ammonium hydroxide solution. From the first brush box cleaning station, the work piece is transported into a rinse station which is the second staging area within the first scrub module. The work piece is held at this stage until the work piece is rinsed and a determination is made that the preceding work piece has cleared the next stage area. While held in the rinse station/second stage, water jets spray the top and bottom surface of the work piece to rinse away the first chemical cleaning agent remaining on the work piece before moving the work piece into a mid station that is free of chemical cleaning agents and where the work piece is again staged. From the second stage area, water jets urge the work piece into and past the mid station and then into a second scrub module for a second cleaning of the work piece, using a second chemical cleaning agent that is preferably an HF cleaning solution. Isolation slots in the water tracks and water track shields restrict the first chemical cleaning agent to the first scrub module and the second chemical cleaning agent to the second scrub module. After being scrubbed and cleaned with the second chemical cleaning agent, the work piece exits the second brush box station and is conveyed into the second rinse station/third stage area where the work piece is again rinsed, top and bottom, to remove residual contamination and to neutralize the second chemical cleaning agent. From the third stage area, the work piece is transported via a water track to an additional rinse station. After the additional rinsing, the work piece is moved to a spin dryer station where it is again rinsed and then spun dried. The cleaned work piece is then returned to a cassette.

The brush boxes of the cleaning apparatus preferably comprise a plurality of pairs of brush rollers that pull the work pieces through the brush boxes and that also clean the substantially planar top and bottom surfaces of the work pieces. Various rollers within the brush boxes may operate at different rotational speeds and rotate in different directions. In this manner, certain rollers may function as drive rollers to move work pieces through the cleaning stations, while other rollers may function to clean work piece surfaces as the work pieces are driven through the cleaning stations.

In a particularly preferred embodiment, the rollers are contained in enclosed boxes that may be easily removed from the machine to facilitate convenient changing of the rollers as the roller surfaces become worn through extended use. A plurality of channels are preferably formed in an upper inside surface of the brush boxes to permit distribution of a plurality of different chemicals (e.g., water, cleaning solutions including acidic solutions such as dilute HF solutions and basic solutions such as ammonium hydroxide solutions, surfactants, agents to control the pH of the various solutions, and the like) into discrete regions of the brush boxes. In this manner, work pieces passing through a brush box may be exposed to a first chemical solution in a first stage of the brush box and later exposed to a second chemical solution in a latter stage of the brush box. Since a plurality of brush boxes are preferably employed, different chemicals may be used in each of the different brush box cleaning stations. The first brush box, for example, may distribute a cleaning solution and deionized water mixture onto the work pieces to facilitate heavier cleaning, while the second brush box may distribute a second cleaning solution or may simply distribute deionized water onto the work pieces to achieve a rinse. Each brush box also incorporates sensors positioned proximate the entrance and the exit of the brush box that sense the presence of a work piece and transmit that information to a brush box controller. The controller utilizes the signals from the sensors to adjust the operation of the brush box rollers, for example, to reverse the direction of the drive rollers causing the work piece to reverse direction. In this way, the sensors and controller may be used to cause the work piece to oscillate back and forth within the brush box to thereby maximize the scrubbing time relative to the time spent entering and exiting the brush box.

In accordance with one embodiment of the invention, work pieces are transported from the second scrub module to a rinse station via a water track. Work pieces are rinsed in a serial manner within the rinse station, and then are transferred to a spin/rinse dryer station. The spin/rinse dryer station provides a final rinse of the work piece and then spins the work piece to remove any residual water from the work piece. Work pieces are retrieved from the spin/rinse dryer station and are preferably returned to the cassette from which they originated. Thus each work piece can be tracked and monitored through the polishing and cleaning steps so that after processing, it can be placed back into its original slot in its original cassette.

A vision system or other position sensing method may be utilized to monitor work pieces as they pass through the cleaning apparatus to determine whether the work pieces have properly moved from one area of the apparatus to the next. Based on the monitored information, work pieces are released from the various staging areas only when it is determined that the workpieces are all safely positioned within the proper staging areas; that is, when it has determined that lodged work pieces are not still in the water track or in the various scrubbing, rinsing and drying stations.

BRIEF DESCRIPTION OF THE DRAWING FIGURES

The present invention will hereinafter be described in conjunction with the appended drawing figures, wherein like numerals generally denote like elements, and:

Figure 8:
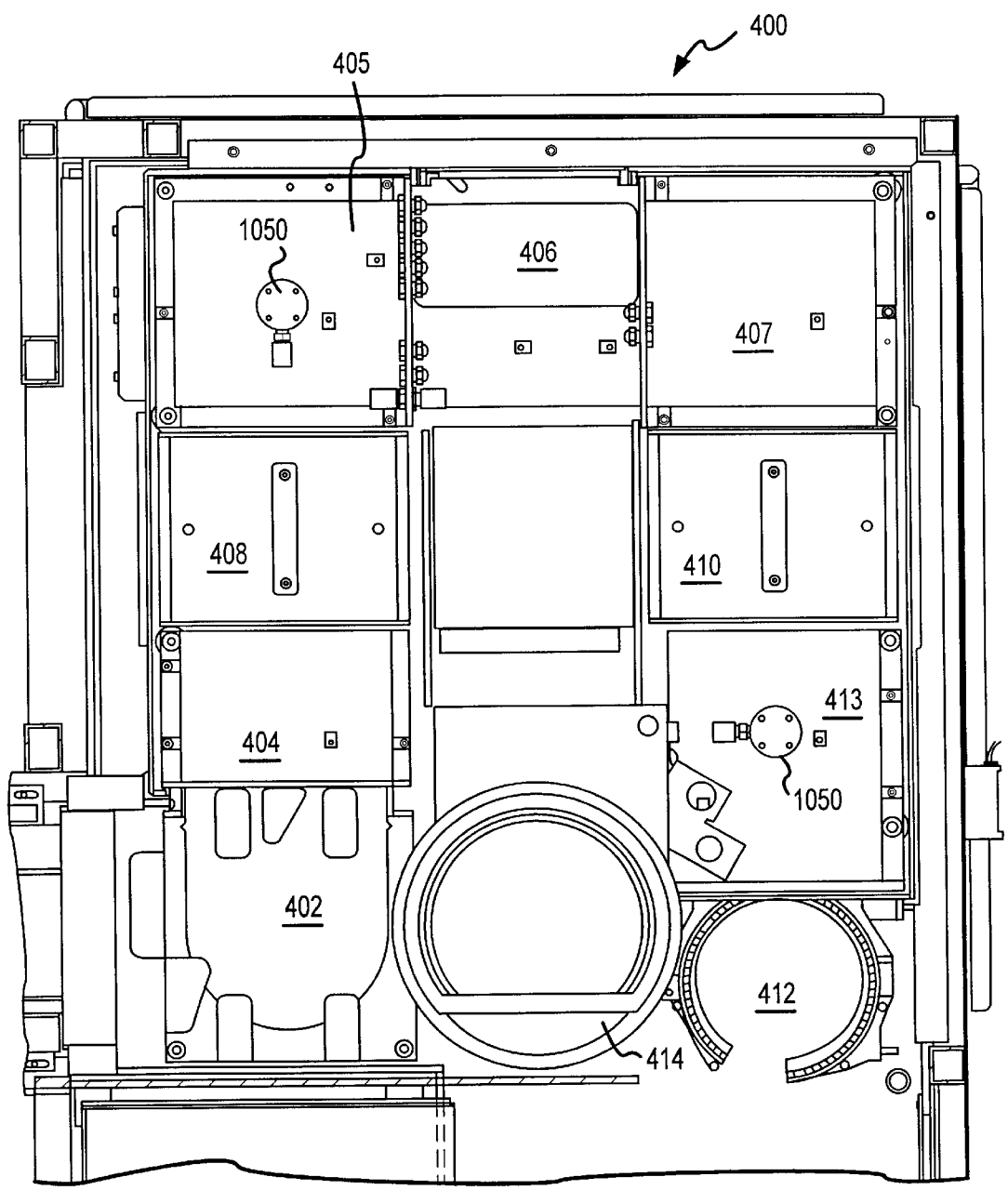
Figure 9:
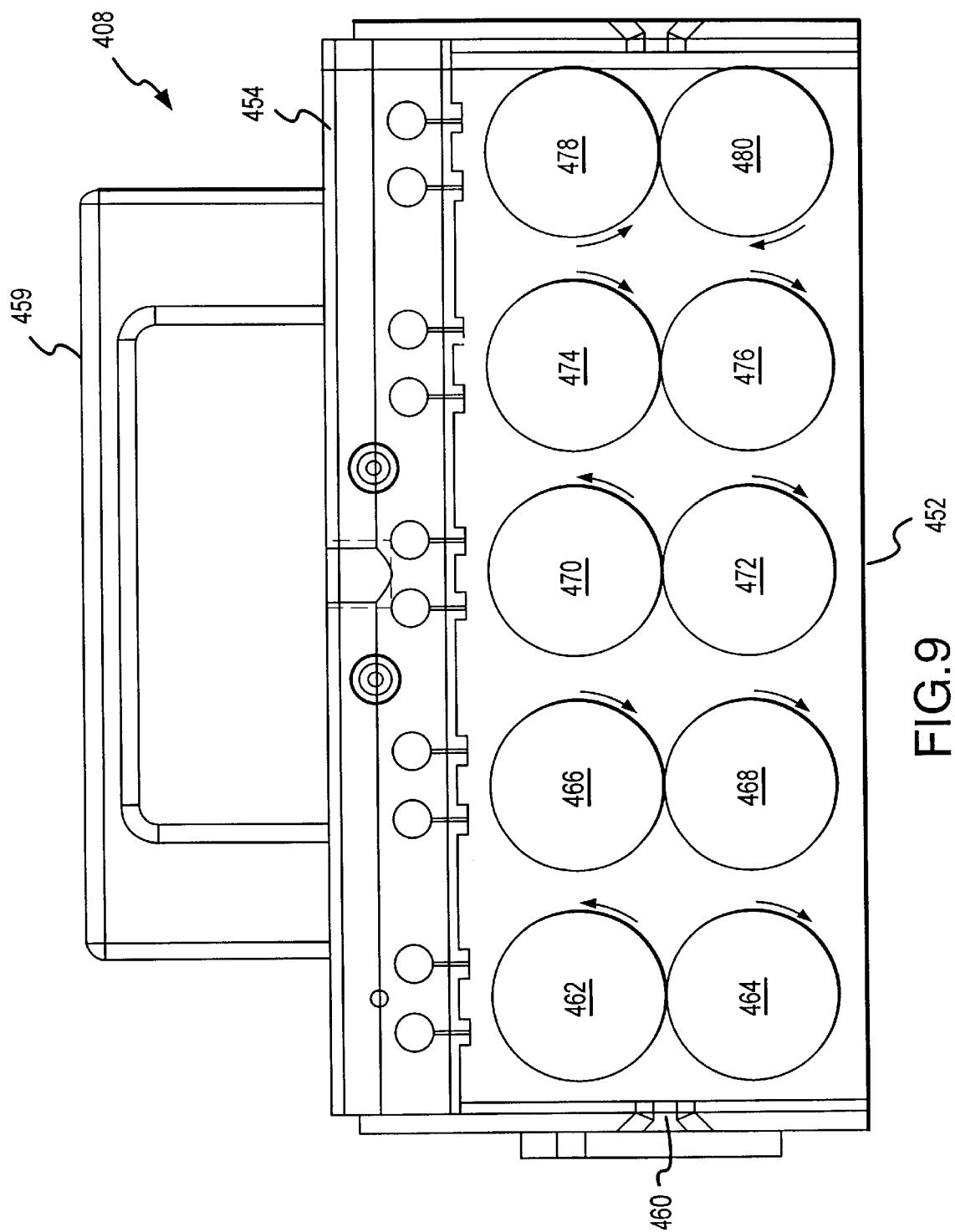
Figure 10:
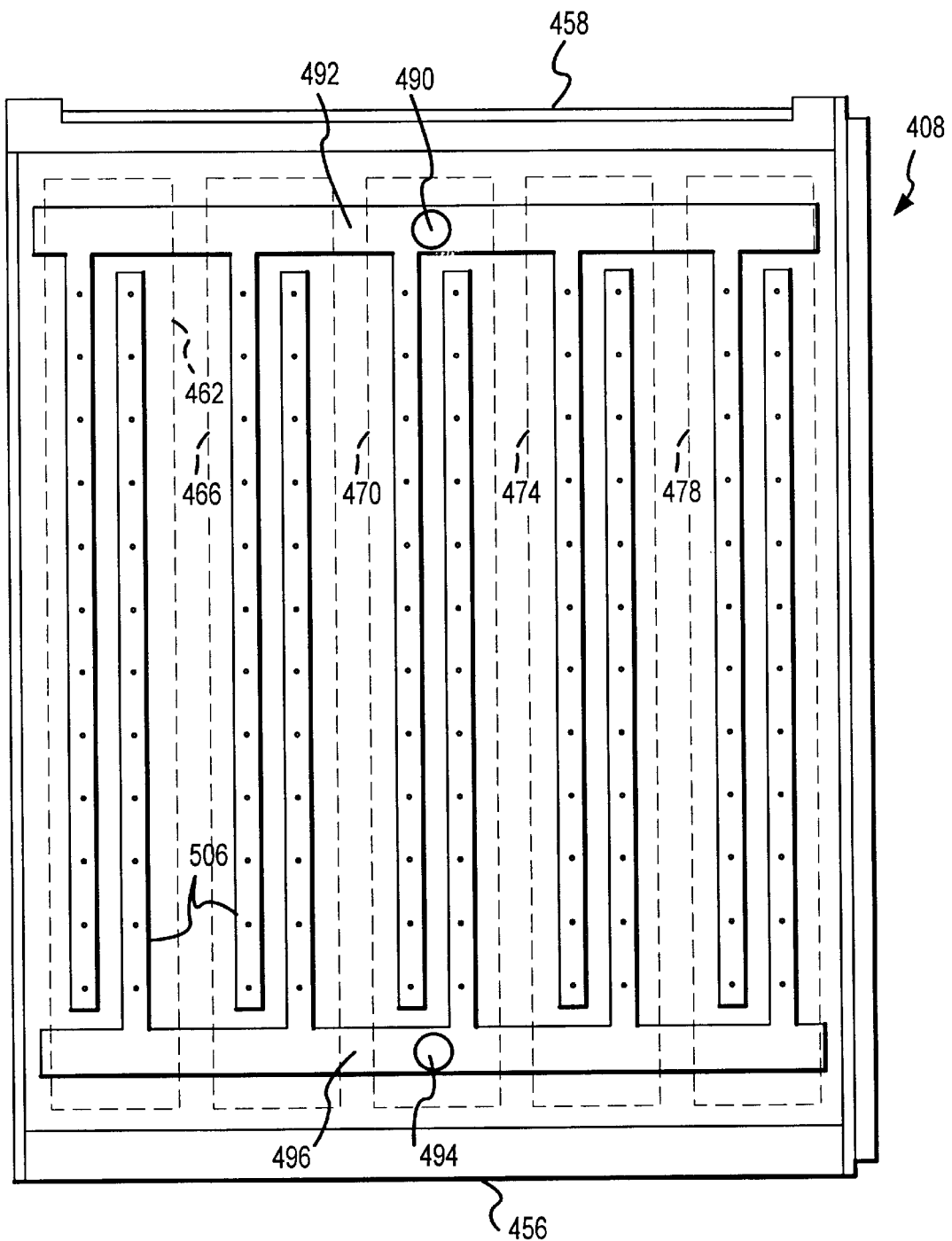
Figure 11:
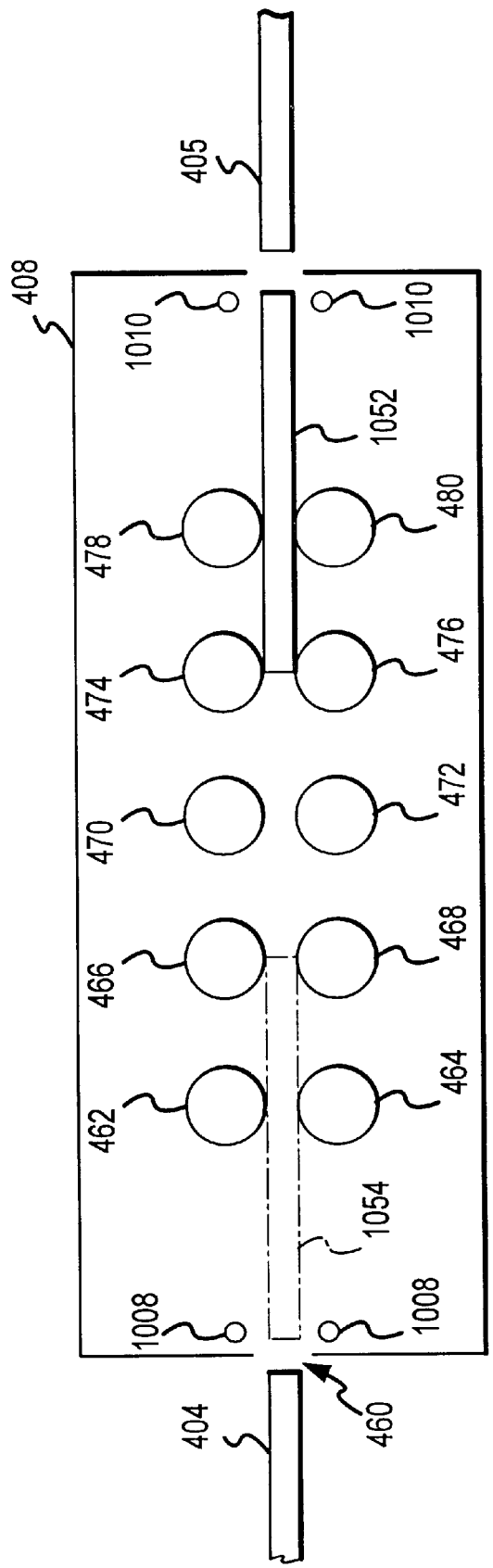
Figure 12:
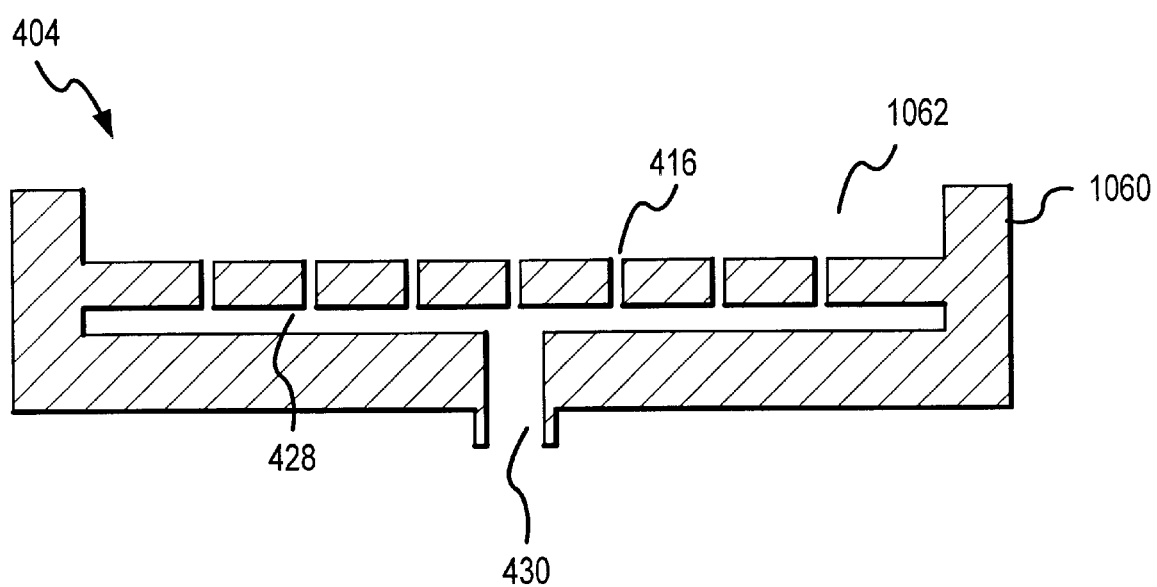
Figure 13:
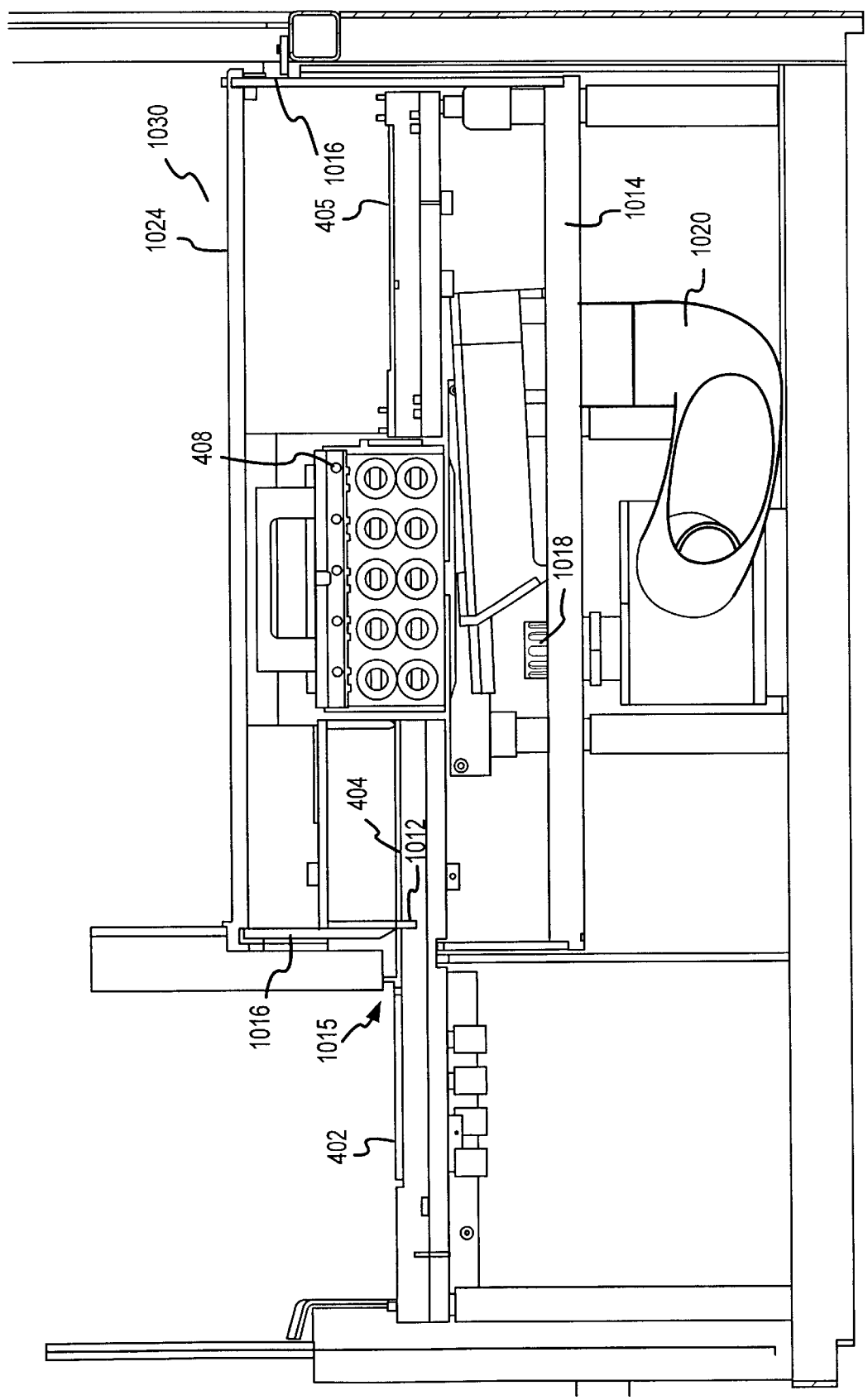

FIGS. 6, 7, and 12 illustrate, in top, side, and end views, respectively, a portion of a water track in accordance with one embodiment of the invention;

FIG. 8 illustrates, in plan view, the cleaning apparatus in accordance with one embodiment of the invention;

FIGS. 9 and 10 illustrate in cross sectional and cut away top views, respectively, a brush box in accordance with one embodiment of the invention;

FIG. 11 illustrates schematically, in cross section, oscillatory motion of a work piece through a brush box in accordance with one embodiment of the method of the invention; and FIG. 13 illustrates schematically, in a sectional view, chemical containment in accordance with one embodiment of the invention.

DETAILED DESCRIPTION OF THE PREFERRED EMBODIMENTS

This invention relates to an apparatus and method for cleaning work pieces, and, in accordance with an embodiment of the invention, to an apparatus and method for cleaning work pieces that are integrated with apparatus and method for CMP polishing of those work pieces. An integrated work piece CMP polishing and cleaning machine 20 according to one embodiment of the present invention is illustrated in plan view in FIG. 1. Although the machine may be applicable to a variety of applications and may be used to process a variety of objects such as semiconductor wafers, magnetic disks, compact disks, and other work pieces that are generally in the form of flat, substantially planar, substantially circular disks, for ease of discussion and for ease of understanding, the machine and the use of the machine will be described in the context of processing semiconductor wafers ("wafers"). Although described and illustrated in the context of processing wafers, it is not intended that the invention be limited to such an illustrative embodiment. It is also not intended that the invention be limited to the use of such cleaning apparatus and method in conjunction with a CMP apparatus and method.

Integrated work piece CMP polishing and cleaning machine 20 comprises wafer load/unload station 100, wafer index station 200, wafer CMP station 300, and, in accordance with one embodiment of the invention, wafer cleaning station 400. Each of the foregoing stations are structurally and functionally described in greater detail below.

Figure 1:
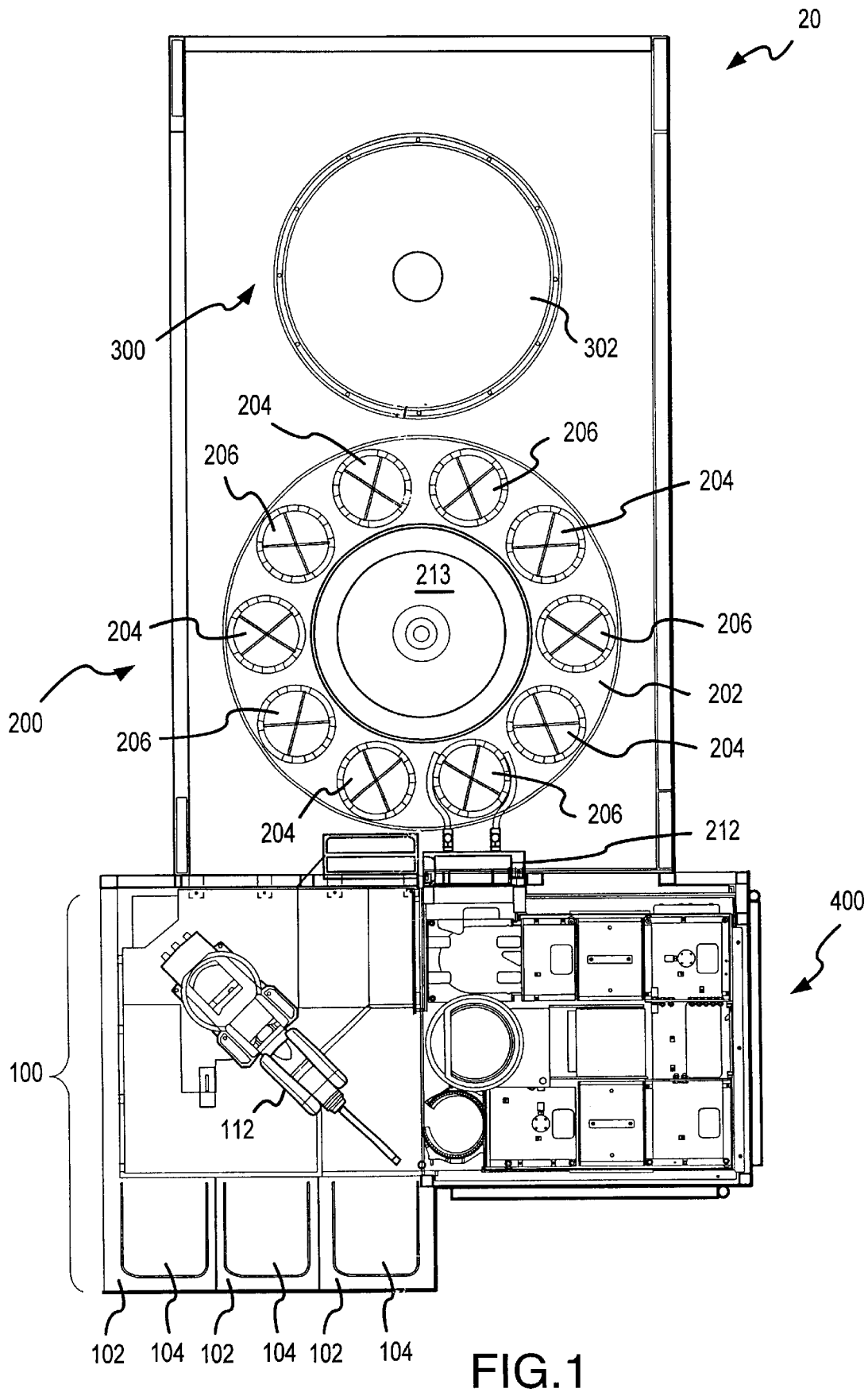
FIG. 1 illustrates, in plan view, an integrated machine for polishing, washing, rinsing, spin-drying, and unloading work pieces in accordance with one embodiment of the present invention.
Figure 2:
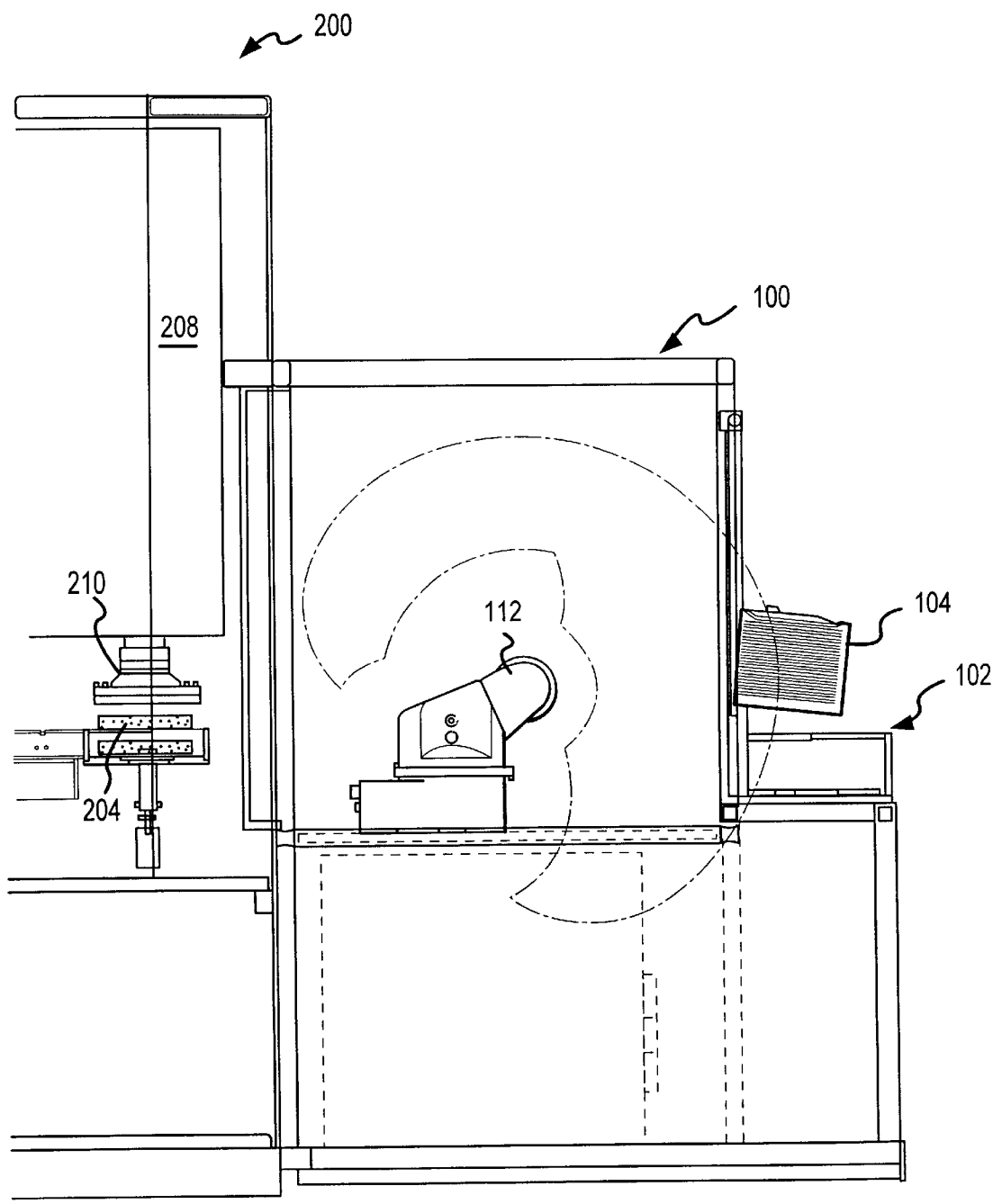
FIG. 2 illustrates, in side view, a portion of the integrated machine of FIG. 1.

With continued reference to FIG. 1 and with additional reference to FIG. 2, it can be seen that wafer load/unload station 100 is configured to accommodate a plurality of wafer cassettes to permit substantially continuous operation of machine 20. Wafer cassettes provide a mechanism for carrying wafers to and away from the machine. Preferably, load/unload station 100 includes three wafer cassette platforms 102, each configured to hold at least one wafer cassette 104 full of wafers to be polished and cleaned. Again, although the present invention is described and illustrated in the context of exemplary work pieces such as semiconductor wafers being polished in a CMP process, virtually any substantially flat, substantially circular work piece may be employed in the context of the present invention.

Typically, three wafer cassettes 104 are loaded into the respective cassette platforms 102. Machine 20 then processes all wafers which reside in a first one of the cassettes 104. After all wafers have been removed from the first cassette 104, machine 20 processes the wafers in the next one of the cassettes 104. After the wafers have proceeded through the CMP and cleaning processes, machine 20 preferably returns the wafers back to the same slot in the same cassette 104 from which they originated. After machine 20 has returned all wafers back to a cassette 104, that cassette may be removed from its cassette platform 102 and a new cassette 104 (filled partially or fully with wafers) is installed in its place. In this manner, substantially continuous, uninterrupted input of wafers into machine 20 may be achieved. Moreover, because machine 20 polishes, cleans, and dries the wafers in one continuous process, the need for separate cleaning machines and additional processing is alleviated. Also, because machine 20 returns the wafers back to the same slot in the same dry cassette from which they originated, the operator and the manufacturing facility can better track each cassette and each wafer through the fabrication process.

Figure 3:
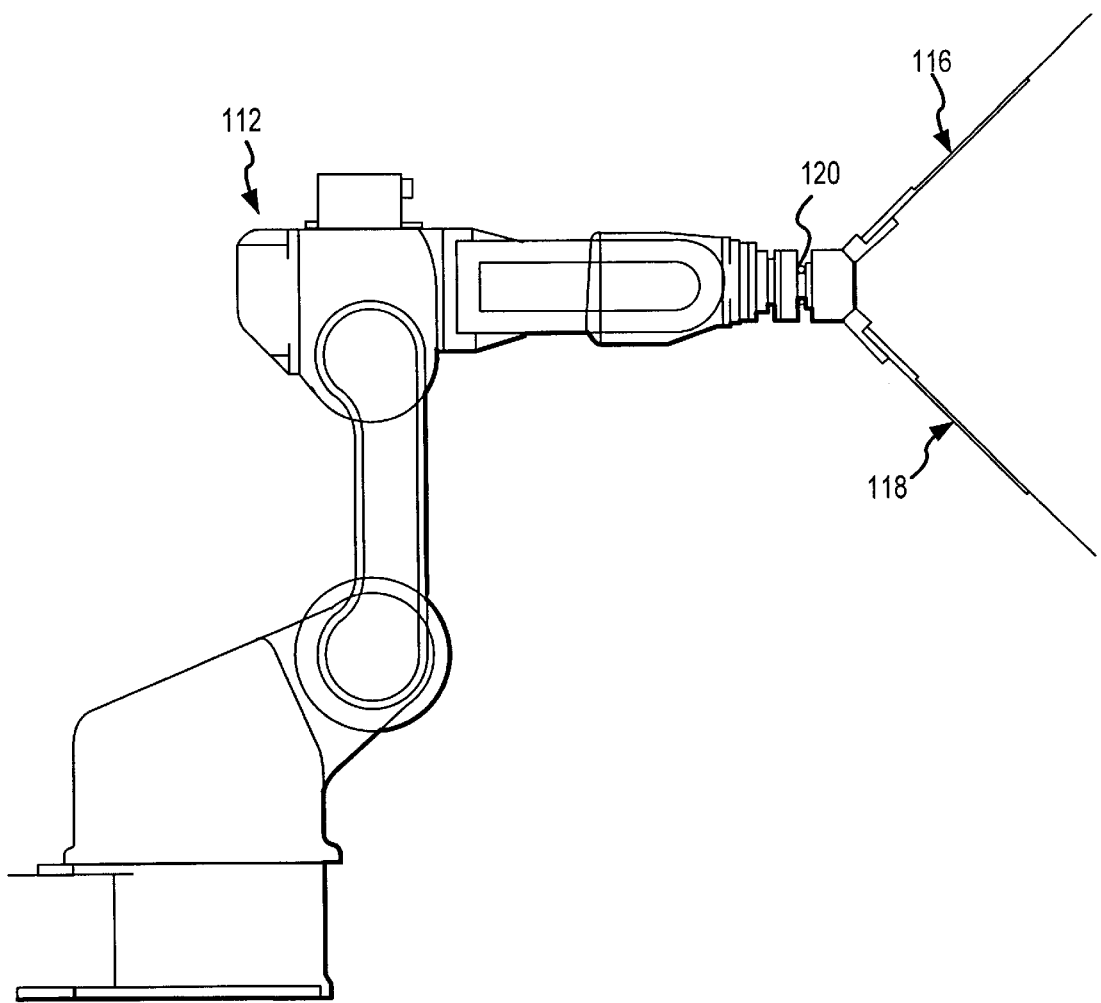
FIG. 3 illustrates, in side view, a robot used in the load/unload station of the integrated machine of FIG. 1.

After cassettes 104 are placed in platforms 102 and machine 20 is set for processing, a robot 112 removes wafers individually from cassettes 104 and moves them to index station 200. Referring now to FIGS. 3, robot 112 preferably comprises a six-axis robot, for example, the SV3 six-axis robot manufactured by Motoman, Inc. of West Carrollton, Ohio. Robot 112 preferably includes two wafer controlling end-effectors 116 and 118 connected to the wrist axis 120 of robot 112. End-effector 116 is configured to handle dry wafers (e.g., wafers in transit from a cassette to the index station and wafers in transit from a spin dryer station to a cassette), and end-effector 118 is configured to handle wet wafers (e.g., wafers in transit from a rinse station to the spin-dry station).

End-effectors 116 and 118 include vacuum holes (not shown) for applying vacuum pressure to wafers held thereon. A vacuum source is configured to supply the necessary vacuum pressure. The vacuum pressure applied to the end-effectors securely holds the wafers on the end-effectors while robot 112 moves the wafers about its various axes.

In accordance with a preferred embodiment of the invention, the various processing steps carried out by machine 20 and its various components are automated under the control of a processor or controller. Those skilled in the art will appreciate that the processor or controller may comprises a single processor, or alternatively, multiple linked processors. The distribution of control functions among multiple processors is well known in the art.

Referring again to FIG. 1, CMP processing of wafers will now be discussed briefly. As mentioned above, robot 112 removes wafers individually from a cassette 104 and transfers them into index station 200. Robot 112 places each wafer, device side down, onto one of a plurality of load cups 204 residing on index table 202. Index table 202 also includes a plurality of wafer unload cups 206 which alternate with load cups 204. After a wafer is deposited on one of the plurality of load cups 204, table 202 rotates so that a new load cup 204 aligns with robot 112. Robot 112 then places the next wafer on the new empty load cup 204. This process continues until all load cups 204 are filled with wafers. Index table 202 preferably includes five load cups 204 and five unload cups 206.

Next, wafer carrier transport assembly 208 having individual wafer carrier elements 210 (see FIG. 2) aligns itself over index table 202, such that respective carrier elements 210 are positioned directly above the wafers residing in respective load cups 204. Load cup assembly 204, with wafers positioned thereon, then raises into proximity with carrier elements 210 such that carriers 210 can retrieve the wafers from the load cups. After each carrier obtains a wafer, load cup assembly 204 lowers and transport assembly 208 moves the carrier elements with their respective wafers laterally into CMP station 300 and positions the wafers above a polishing table 302. Once above polishing table 302, transport assembly 208 lowers carrier elements 210 such that the wafers are pressed into operative engagement with a polishing pad disposed upon polishing table 302. During polishing, polishing table 302 and the polishing pad disposed thereon rotate about their vertical axes. Simultaneously, individual carrier elements 210 spin the wafers about their respective vertical axes and oscillate the wafers back and forth across polishing table 302 as the wafers are pressed against the polishing pad in the presence of a polishing slurry. In this manner, the surfaces of the wafers are polished and/or planarized.

After an appropriate period of processing time the wafers are lifted from the polishing pad and transported back to index station 200. At this time, the wafers may be polished on a second polishing table 213, if desired. Next, transport assembly 208 lowers individual carrier elements 210 which deposit the wafers into unload cups 206. After a batch of polished wafers has been deposited into unload cups 206, index table 202 rotates and load cup assembly 204 is again raised to transfer a new set of wafers to carrier elements 210 from load cups 204 for polishing. The new set of wafers is transported to CMP station 300 and the process repeats. While wafers are being polished in CMP station 300, robot 112 loads unpolished wafers into load cups 204, and flipper arm 212 removes polished wafers from unload cups 206 and transfers them to cleaning station 400. As discussed in more detail below, flipper arm 212 lifts the wafers out of index station 200 and transfers them onto a water track on cleaning station 400.

For a more detailed discussion of CMP processes, and in particular, the detailed workings of CMP machines similar to CMP station 300, see Karlsrud, et al., U.S. Pat. No. 5,329,732, issued July, 1994; Karlsrud et al., U.S. Pat. No. 5,498,196, issued March, 1996; and Karlsrud, et al, U.S. Pat. No. 5,498,199, issued March, 1996, all of which are incorporated herein by reference.

Figure 4:
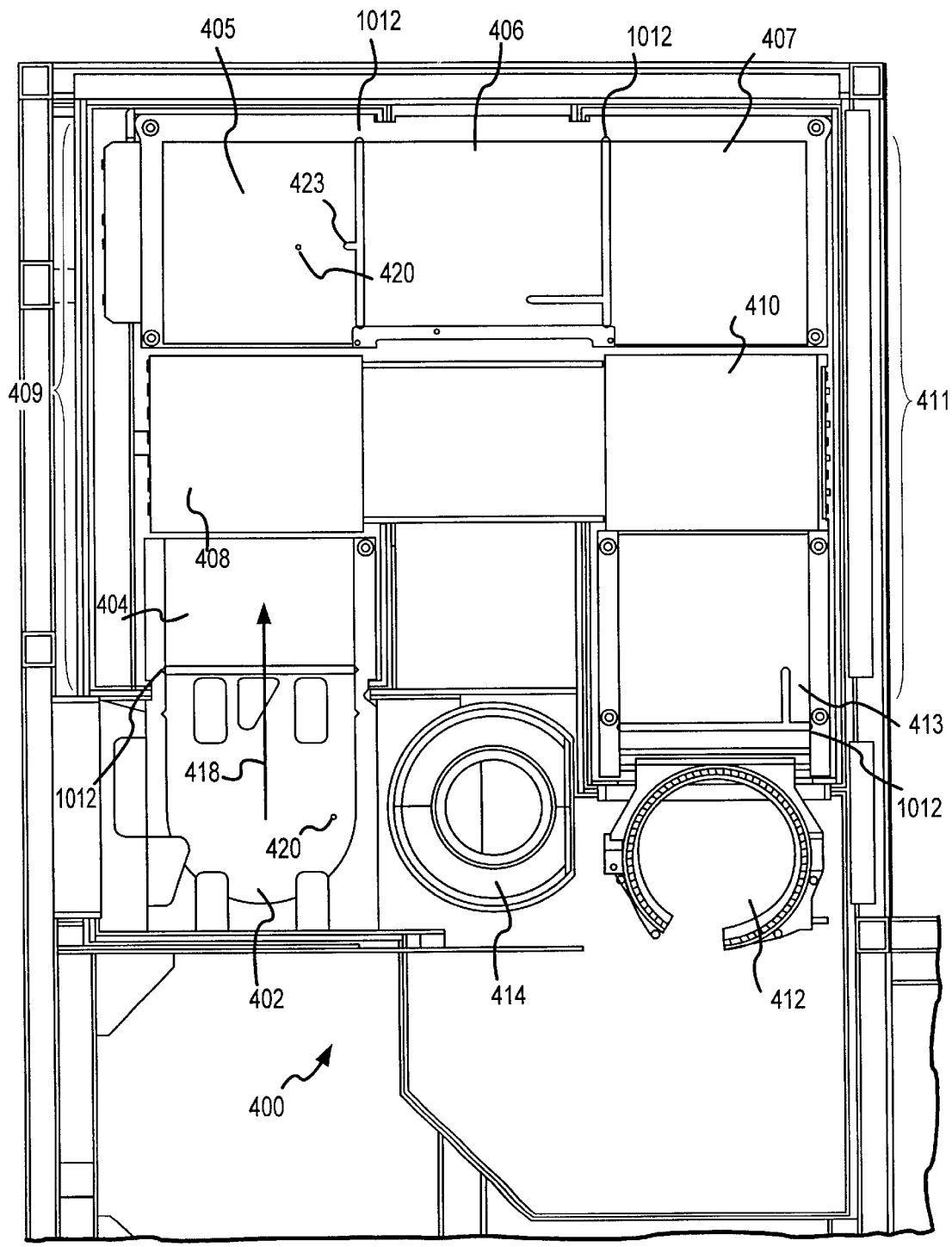
FIG. 4 illustrates, in top view, a work piece cleaning apparatus in accordance with one embodiment of the invention.

Cleaning station 400 is illustrated schematically in plan view in FIG. 4. Cleaning station 400 preferably comprises an input station 402, first scrub module 409, mid station 406, second scrub module 411, rinse ring 412, and spin rinse/dry station 414. The first scrub module comprises a scrub module track 404, brush box 408, and scrub module track 405. Second scrub module 411 comprises a scrub module track 407, scrub box 410, and scrub module track 413.

Figure 5:
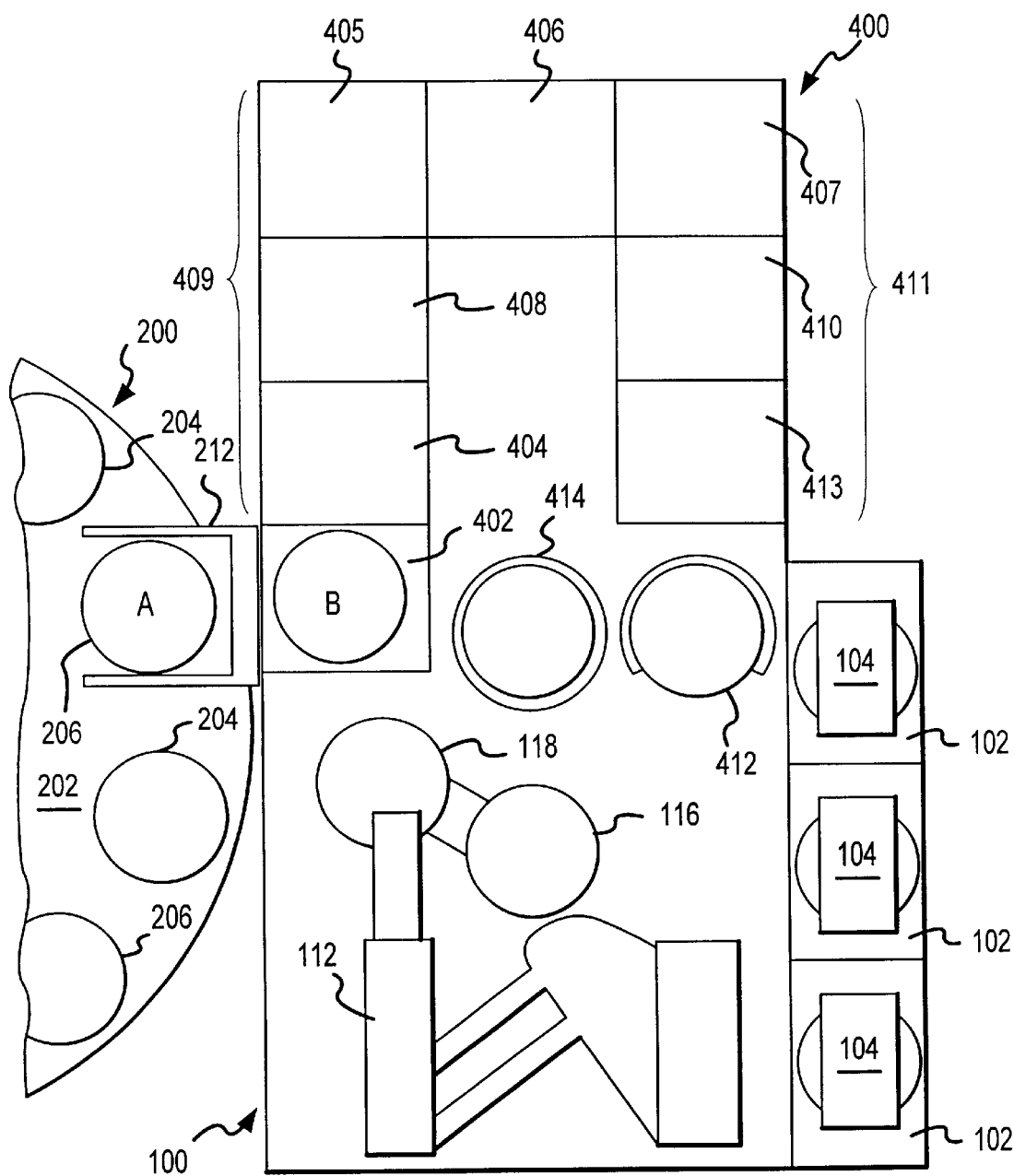
FIG. 5 illustrates schematically, progression of a work piece through the cleaning process in accordance with one embodiment of the invention.

Prior to describing the various substations of cleaning station 400 in detail, the wafer flow between index station 200, cleaning station 400, and load/unload station 100 will be described in very general terms. FIG. 5 provides an exemplary illustration of the wafer flow between these stations. As will be described in greater detail below, a number of sensors are strategically positioned about the equipment to sense the presence or absence of a wafer in each of the locations in the cleaning apparatus. Before a wafer can be moved from one location to the next, not only must processing at the first location be complete, but it must be verified that no wafer is present at the next processing location. Hence, if one of the stations in the machine malfunctions, or if a wafer becomes lodged or broken, a sensor will indicate that a wafer is present in that location and the flow of wafers to that location will be halted until the problem is reconciled. To illustrate this important system of checks, the progress of two hypothetical wafers will be tracked: a wafer "A" that begins at unload cup 206 of index table 202 and a wafer "B" that begins in the next immediate station, input station 402. Refer to FIG. 5 for this tracking illustration.

Before wafer "A" can be moved by flipper 212 into input station 402, the machine controller, utilizing the appropriately located sensors, must first verify that wafer "B" has passed from input station 402 to scrub module track 404 and first brush box 408. Once this is verified, flipper 212 moves wafer "A" from unload cup 206 to input station 402. Wafer "A" can subsequently be moved from input station 402 into scrub module track 404 and brush box 408 only when it is verified that wafer "B" has moved onto mid station 406. Wafer "A" is retained in first scrub module 409 until scrubbing and rinsing of wafer "A" is complete and until it is verified that wafer "B" has moved into scrub module 411. When it is verified that wafer "B" has moved into scrub module 411, wafer "A" is moved into mid station 406. When the sensors send signals verifying that wafer "B" has moved into rinse ring 412, wafer "A" is moved into scrub station 411. When rinsing of wafer "B" is complete at rinse ring 412, wet end-effector 116 of robot 112 retrieves wafer "B" from rinse ring 412 and transfers it to spin rinse/dryer 414. When this step has been verified, wafer "A" is passed into rinse ring 412 from scrub module track 413 of the second scrub module 411. Wafer "A" remains in rinse ring 412 until rinsing is complete and until it is verified that wafer "B" has been removed from spin rinse/dryer station 414 by dry end-effector 118. Upon such verification, wafer "A" is retrieved from rinse ring 412 by the wet end-effector 116 of robot 112. Wafer "A" is then moved into spin rinse/dryer station 414 and wafer "B" is placed in the proper slot of an unload cassette 104 by dry end-effector 118. Upon verification that wafer "B" has been placed in the unload cassette, wafer "A" is retrieved from the spin rinse/dryer by dry end-effector 118 and placed in its proper slot in unload cassette 104.

With this general framework of the wafer flow established, the detailed operations of each of the various substations will now be described. With reference to FIGS. 4, 6 and 7, first input station 402 is configured to receive a wafer and hold it in a staging position until the first scrub module is ready for the wafer to be released. When ready, first input station 402 guides the wafer in a non-contacting fashion into scrub module track 404 and then into first brush box 408. The bounds of input station 402 and scrub module track 404 are indicated by dashed lines in FIG. 6. The terms "non-contacting" and "without mechanical contact" shall herein mean that the wafer is substantially not in contact with another solid. That is, the wafers are moved along or "floated" on a fluid "cushion" to minimize physical damage to the wafers.

Upon being received by cleaning station 400, the wafers are supported by fluid (preferably water) which is projected upwardly from the plane of the track through a plurality of fluid jets, as described in greater detail below, such that solid mechanical contact between the wafers and the water tracks is substantially eliminated. Although other fluids may be employed, for ease of discussion the fluid tracks will be referred to herein as "water tracks."

Input station 402 and scrub module track 404 preferably include a plurality of fluid jets 416 configured to urge wafers out of the water track along the direction of arrow 418 and into first brush box 408. More particularly, fluid jets 416 are oriented to discharge fluid upwardly at a 90 degree angle with respect to the horizontal plane. In this way, a wafer received from index station 200 floats on the water tracks of input station 402 and scrub module tracks 404, 405, 407, 413, and mid station 406 substantially without solid mechanical contact. Fluid is preferably supplied to individual fluid jets 416 through a fluid manifold 428. Manifold 428 is located beneath the top surface of the water track and is in fluid communication with jets 416. Fluid is supplied to manifold 428 by fluid source 430.

With continued reference to FIGS. 4, 6, and 7 input station 402 further comprises a detection sensor 420 disposed proximate an edge of the input station. A plurality of sensors such as sensor 420 are positioned about machine 20 and monitor the steady state operation of machine 20, particularly that of cleaning station 400, and may be configured to generate an alarm, or to stop machine operations in the event that a wafer is detected as being "hung up" or otherwise lodged in the vicinity of the sensor. Sensor 420 may also be employed to count wafers as they pass by (or to confirm that no wafer is present) to thereby confirm that machine 20 is operating properly. It should be appreciated that input station 402 could utilize any appropriate number of sensors to measure throughput of wafers or for diagnostic purposes. In addition, and as discussed in more detail below, similar detection sensors may be positioned in scrub module tracks 404, 405, 407, 413 and mid station 406. Detection sensor 420 may comprise any suitable mechanism for detecting the presence and/or absence of a work piece, such as an optical sensor or the like.

During operation, a wafer is typically held in input station 402 until the system has determined, based on signals received from the sensors, that the subsequent stage is clear to receive the next wafer. Input station 402 includes reverse fluid nozzles 424 to help maintain the wafer within the track. Reverse fluid nozzles 424 are used to apply fluid pressure to the wafer, preventing it from continuing down the track. Reverse fluid nozzles 424 push the wafer back in the direction opposite to arrow 418, thus keeping the wafer within the track staging location. When the system has determined that it is safe for the wafer to be passed on to the next processing station, reverse fluid nozzles 424 turn off. In addition, a forward fluid nozzle 426 provides a burst or steady stream of fluid to encourage the wafer along the track in the direction indicated by arrow 418 and into track 404. Reverse fluid jets 424 and fluid jet 426 preferably have independent fluid sources similar to fluid manifold 428 and fluid source 430.

FIG. 4 further illustrates the configuration and operation of scrub module tracks 404, 405, 407, 413, and mid station 406. Like input station 402, each of these water tracks include a plurality of fluid jets 416 to supply a fluid, preferably water, upon which the wafers are supported as they move along the track. The first scrub module 409 includes two water track portions, scrub module track 404 for receiving a wafer from input station 402, and a second portion, scrub module track 405, that functions as a staging area for receiving a wafer discharged from first brush box 408. Scrub module track 405 includes a staging pin 423 for maintaining the wafer in the staging area until the next processing station is ready to receive it. Staging pin 423 comprises a mechanically or pneumatically operated pin device that projects downwardly from above the top surface of water track 405 when engaged and prevents the wafer from continuing down the track. Staging area 405 also includes a detection sensor 420 for detecting the presence of a wafer in the staging area and a fluid nozzle 426 for moving a wafer from the staging area at the appropriate time. Staging pin 423 is operated in response to signals from detection sensors 420 indicating the location of wafers within cleaning station 400.

After the system has determined, in accordance with signals received from the various sensors deployed in the apparatus, that the next processing station is clear to receive a wafer, reverse nozzles 424 are turned off and fluid nozzles 426 eject fluid to urge the wafers from input station 402 into scrub module track 404 in the direction indicated by arrow 418 and then into the first brush box 408. The function of brush box 408 and its action on the wafer contained therein is explained more fully below. Following the completion of a scrubbing process in brush box 408, the wafer is ejected from brush box 408 into scrub module track 405. Scrub module track 405 serves as a staging area and also as a rinse area. During the cleaning process in brush box 408 the wafer comes in contact with a first cleaning agent which must be thoroughly removed from the wafer before additional processing can take place. Staging pin 423 maintains the wafer in the rinse area 405 until it is appropriate for the wafer to move from that area. While in the rinse area the surfaces of the wafer are rinsed by fluid from the plurality of fluid jets that make up the water track and also by fluid ejected by a rinse head 1050 seen in FIG. 8. This removes the chemical cleaning agents from the wafers and dislodges any particles remaining on the wafers after scrubbing After the rinsing operation is completed and after the system has determined that the next processing station is clear to receive the wafer, staging pin 423 of scrub module track 405 is raised, and fluid nozzles 426 eject fluid to urge the wafer along the water track and into mid station 406. Like input station 402 and scrub module tracks 404, 405, mid station 406 comprises a water track that includes a plurality of fluid jets 416 that upwardly project fluid to support the wafer and to avoid mechanical contact between the wafer and the solid support of the water track. Mid station 406 functions as a staging area for properly staging wafers between brush module 409 and brush module 411. In addition, water track 406 functions to isolate fluids in water track 404 from fluids in water track 407. The isolation between water tracks will be explained more fully below.

Scrub module tracks 407 and 413 are similar to scrub module tracks 404 and 405. Scrub module track 407 functions as a staging area prior to brush box 410, and scrub module track 413 functions as a rinsing area located at the exit of brush box 410. Like water track 404, water track 407 includes a plurality of fluid jets 416 that project fluid upwardly to support the wafer and to avoid mechanical contact between the wafer and the solid support of the water track and fluid nozzles 426 that urge wafers forward at the appropriate time. The rinsing area of scrub module track 413 includes two sets of reverse nozzles 424; one set prevents wafers from passing into the next processing station, i.e., rinse ring 412, and one set prevents wafers from moving back into brush box 410. As with the rinsing area of scrub module track 405, the rinsing area of scrub module track 413 includes, in a preferred embodiment, a fluid spray rinse nozzle 1050. Fluid nozzles 426 and reverse nozzles 424 are not shown in the figures, but are similar to those illustrated in input station 402. Like brush box 408, brush box 410 may use a chemical cleaning agent and it is necessary to remove this cleaning agent from the surfaces of the wafer.

As with the water tracks of input station 402 and scrub module track 404, the water tracks of scrub module 411 include at least one fluid source 430 for providing fluid to manifold 428 and, in turn, to fluid jets 416. Similarly, it is preferred that reverse fluid nozzles 424 and fluid nozzle 426 have independent fluid sources.

In addition to rinse spray nozzles 1050, input station 402, water tracks 404, 405, 407 and 413 and mid station 406 preferably further include mechanisms (not shown), such as wetting nozzles, for keeping wafers wet as they are staged in and/or pass along the water tracks. Alternatively, fluid jets 416, reverse fluid nozzles 424 and fluid nozzles 426 may be used for this purpose.

Brush boxes 408 and 410 of scrub modules 409 and 411, respectively, preferably include an enclosure housing a plurality of pairs of rollers. FIG. 9 and FIG. 10 illustrate a brush box 408 in accordance with one embodiment of the invention. FIG. 9 illustrates brush box 408 in cross sectional view and FIG. 10 illustrates the brush box in a cut away top view. For sake of brevity, only one exemplary brush box 408 is described herein; brush box 410 can be of similar construction and operation. Brush box 408 includes a bottom panel 452, a top panel 454, a rear panel 456, and a front panel 458. Hence, the panels make up a self-contained box that can be quickly and easily removed, using handle 459, and replaced when it is desired to replace one or more of the rollers. The ability to quickly and conveniently remove and replace rollers and/or brush boxes in the context of the present invention further facilitates the substantially continuous operation of machine 20. Commercially available brush boxes such as brush boxes manufactured by Wacker Chemtronic company of Germany may be utilized.

Each brush box 408 includes a plurality of roller pairs configured to drive wafers through the brush box and to simultaneously clean the top and bottom flat surfaces of wafers passing therethrough. As shown in FIG. 9, brush box 408 preferably includes a wafer input 460 configured to receive wafers into the enclosure from the associated water track. When a wafer enters the enclosure, the first pair of drive rollers (described below) "grabs" the wafer and feeds it forward to the next pair of rollers.

Brush box 408 has three to twelve pairs of rollers, and preferably five pairs of rollers. In the illustrated embodiment, the brush box includes a first roller pair with an upper roller 462 and a lower roller 464; a second roller pair with an upper roller 466 and a lower roller 468; a third roller pair with an upper roller 470 and a lower roller 472; a fourth pair with an upper roller 474 and a lower roller 476; and a fifth terminal roller pair with an upper roller 478 and a lower roller 480. As best viewed in FIG. 9, cleaning station 400 is configured such that wafers initially enter brush box 408 from the far left, are sequentially urged through the box, and are ultimately discharged from the brush box at the far right position (proximate rollers 478 and 480).

Each of the odd pairs of rollers (e.g., the first, third, fifth roller pairs) preferably functions as a drive roller, with each drive roller pair operating at a drive speed S1. As such, rollers 462, 464, 470, 472, 478, and 480 operate at drive speed S1. The bottom rollers (i.e., rollers 464, 468, 472, 476 and 480) rotate clockwise as shown in FIG. 9. In addition, the top roller of each even roller pair (i.e., rollers 466 and 474) also rotates clockwise from the perspective shown in FIG. 9. Finally, the top roller in each odd roller pair (i.e., rollers 462, 470, and 478) preferably rotates counterclockwise.

The even bottom rollers (i.e., rollers 468 and 476) are preferably configured to operate at a second drive speed S2, and the even top rollers (i.e., rollers 466 and 474) are configured to operate at a process speed S3. The compression between the rollers of each roller pair is approximately uniform throughout the brush box.

Each odd roller pair is preferably driven by a first drive motor so that the wafers are driven through the cleaning station at an essentially uniform rate. Every even top roller is preferably driven by a second motor at process speed S3; and every even bottom roller is preferably driven by the second motor at second drive speed S2 at a predetermined gear ratio below process speed S3. In this way, the operator may control the drive speed S1 by setting a first control associated with the first motor and may also independently control drive speed S3 by manipulating a second control associated with the second motor. By so doing, the operator also indirectly controls drive speed S2, as drive speed S2 follows drive speed S3 in accordance with the predetermined gear ratio discussed above. By allowing the operator to dynamically configure respective drive speeds S1, S2, and S3, substantial processing flexibility is achieved in brush boxes 408, 410. Moreover, by setting S3 higher than S1, the even roller pairs effectively clean the top and bottom surfaces of the wafers as the wafers are simultaneously moved through the brush box at drive speed S1 by the drive rollers (e.g., the odd roller pairs).

Although the aforementioned roller speeds reflect the best mode of practicing the invention known to the inventors at the time this application was filed, it is to be understood that virtually any number of rollers and any combination of roller speeds and roller directions may be employed in the context of the present invention. For example, two, three, or even more roller speeds may be employed, with various permutations and combinations of speed and direction being selected to achieve optimum cleaning performance for a desired application. In addition, the rotation of the brushes may be reversible to assist with wafer staging, that is, the reverse rotation of the brushes can be used to maintain the wafer in the brush box until the next station is available to receive the wafer. In addition, the reverse rotation of the brushes can be used to cause the wafer to reverse direction and travel backward (toward the left in this illustration) in the brush box. As described in greater detail below, this reverse direction capability makes it possible to scrub the wafer for a longer period of time in each brush box, which has substantial benefits for scrubbing with chemical cleaning agents such as an HF solution that require precise control of the scrubbing time or otherwise benefit from an extended scrubbing time. Scrubbing while the wafers move in first one direction and then in the reverse direction also aids in effectively removing particles from the wafer surface.

Again referring to FIGS. 9 and 10, top panel 454 of the brush box includes one or more fluid inlet ports configured to distribute fluid to a discrete portion of, or to the entirety of, the inside of brush box 408. Top panel 454 preferably includes a number of manifolds arranged to deliver fluid to specific locations within the brush box. In particular, panel 454 comprises a first fluid inlet port 490 that communicates with a first manifold 492 configured to distribute a first fluid proximate a number of rollers within the brush box. First manifold 492 is preferably disposed to release fluid substantially evenly along the length of one or more of the top rollers. Top panel 454 further comprises a second fluid inlet port 494 similarly configured in communication with a second manifold 496 for distributing a second fluid throughout a different portion of the brush box, for example, in the region occupied by the first several roller pairs. If necessary for the particular cleaning operation, top panel 454 can further include additional fluid inlet ports in communication with a additional manifolds configured to distribute additional fluid throughout the brush box.

Each individual manifold is configured such that it is fluidly distinct from each of the remaining manifolds. However, one or more of the fluid inlet ports may be coupled together such that a single fluid may be applied to more than one manifold. In the exemplary embodiment shown in FIG. 10, the manifolds are configured to distribute cleaning fluid to locations above and/or between adjacent rollers (the rollers are depicted in phantom lines in FIG. 10). This arrangement permits the cleaning fluid to reach wafers as they pass through the brush box.

Each individual manifold preferably includes a plurality of extending channels 506. Channels 506 associated with opposing manifolds, e.g., first manifold 492 and second manifold 496, may be arranged in an alternating configuration. Of course, it is to be appreciated that any number of fluid inlet ports and/or fluid manifolds may be employed in conjunction with brush box 408, and that the manifolds may communicate with any desired portion of brush box 408 with or without overlap, to optimize particular processing applications.

Top panel 454 is preferably manufactured as a one-piece, substantially seamless assembly. The seamless construction enables manifolds 492 and 496 to be pressurized without leaking cleaning fluid, water, or chemicals to the external portion of brush box 408. In one exemplary construction, manifolds 492 and 496 are formed by drilling or boring into a solid piece of polypropylene or other rigid engineering polymer material. Channels 506 (oriented vertically in FIG. 10) are formed such that adjacent channels originate at opposite sides of top panel 454. Plugs may be employed to seal the entry holes formed during the boring or drilling process.

In addition, brush boxes 408 may include a fluid nozzle (not shown) at the location where wafers exit the brush boxes to give the wafers a thorough rinse or flush as they exit the brush box. In accordance with this aspect of the invention, the post scrub station rinse insures that loosened particles do not settle back on the wafer surface as the wafer exits box 408. The rinsing operation or operations also remove the hazardous cleaning chemicals such as HF. Alternatively, instead of using a spray nozzle on brush box 408, the post scrub station rinse may be accomplished by increasing fluid flow in the water track at the location the wafer enters the track. In this manner, the existing water track configuration may be utilized, thus, eliminating the need for an extra fluid nozzle associated with brush box 408. Additionally, fluid spray nozzles 1050 (FIG. 8), as explained above, provide a thorough rinsing of the surfaces of the wafers after the completion of the scrubbing process.

Referring now to FIG. 11, in which brush box 408 is schematically illustrated in cross section, in accordance with one embodiment of the invention, sensors 1008 and 1010 are positioned at the ends of the brush box for detecting the presence of a wafer. The sensors may be mounted in the brush box as shown, or, alternatively, outside the brush box in the water track portion as desired. Also illustrated are three pairs of drive rollers, 462, 464, 470, 472, and 478, 480 and two pairs of scrub rollers, 466, 468, and 474, 476. Preferably the sensors 1008, 1010 are positioned such that as the edge of a wafer 1052 is sensed by one of the sensors, the opposite edge of the wafer is between the pair of scrubbing rollers nearest that sensor. For example, when sensor 1010 first indicates the presence of a wafer moving to the right (as seen in FIG. 11), the opposite edge of the wafer is between scrubbing rollers 474, 476.

The signals from sensors 1008, 1010 can be used to trigger a change in the direction of the drive rollers in the brush box, and thereby change the direction of movement of the wafer in the brush box. In this way, as a wafer 1052 moving from left to right in the brush box of FIG. 11 encounters sensor 1010, the sensor 1010 generates a signal that is processed to cause the drive rollers to reverse direction, and to cause the wafer to move from right to left away from sensor 1010 and toward sensor 1008. Then as the wafer encounters sensor 1008 (in the position shown in phantom at 1054), the sensor generates a signal causing the drive rollers and wafer to again reverse direction and move from left to right back toward sensor 1010. This process may be repeated as many times as necessary for the particular cleaning operation being performed. By positioning the sensors as described above such that the opposite edge of the wafer is between the nearest pair of scrubbing rollers, the entire surface of the wafer is scrubbed by each pair of scrubbing rollers on each pass before the wafer reverses direction. Brush box 408 is illustrated in FIG. 11; brush box 410 can be similarly configured.

Oscillating the wafer within the brush box in this way is particularly beneficial for performing cleaning operations involving certain chemicals, such as the use of dilute HF solutions, for which, for example, the amount of contact time between the chemical and the wafer must be closely controlled. By oscillating the wafer within the brush box, the wafer is scrubbed for an extended period of time, thus providing for use of safer more diluted concentrations of HF in the cleaning solution. Also, the oscillating feature of the present invention provides for continuous extended scrubbing of the wafer. In prior art HF scrubbing cleaners, either the wafer was run more slowly through the brush box, or the brush box was made longer to accomplish extended scrubbing. In the case of moving the wafer more slowly, substantial scrubbing time is lost while part of the wafer is outside the brush box as the wafer slowly enters and exits the brush box. The brush box of the present invention substantially reduces the amount of time that portions of the wafer are outside the brush box by moving the wafer at a higher speed than prior art HF brush boxes. Thus the ratio of scrubbing time to entering and exiting time is substantially increased, and, more importantly, as a result the wafer throughput is increased.

Referring again to FIG. 4 and also to FIG. 12, the unique system, in accordance with one embodiment of the invention, for containing and managing the chemical cleaning agents used in the brush boxes, such as ammonium hydroxide and HF solutions, will be described. Referring first to FIG. 4, scrub module tracks 404, 405 and 407, 413 service the brush boxes 408 and 410, respectively, and are thus exposed to the chemical cleaning agents used therein. Different cleaning agents may be used in the two brush boxes, or the same cleaning agent may be used in both brush boxes. In a preferred embodiment, a wafer is cleaned in brush box 408 using a first chemical cleaning agent such as ammonium hydroxide and in brush box 410 using a second chemical cleaning agent such as a dilute solution of HF.

Especially when using different first and second cleaning agents, it is necessary to provide isolation between the two brush boxes and their related scrub module tracks. Isolation slots 1012 are provided at the ends of each scrub module track to prevent cross contamination from one scrub module track to the next. This is necessary to insure that the various chemical cleaning agents are not inadvertently mixed and also to insure that cleaning by one cleaning agent is confined to a specified portion of the cleaning station. That is, for example, once the cleaning agent used in brush box 408 is rinsed from the surface of a wafer in the rinse station of scrub module track 405, it is intended that the wafer not be exposed to residual amounts of that cleaning agent when the wafer passes to the water track of mid station 406. Thus, in accordance with an embodiment of the invention, chemical isolation is provided between scrub module track 405 and mid station 406, and between mid station 406 and scrub module track 407. And, importantly, chemical isolation is provided between scrub module 409 and scrub module 411.

FIG. 12 illustrates, in cross section, a portion of a water track such as scrub module track 404. The other water tracks of cleaning station 400 can be of similar construction and operation. The water track is formed of a solid member 1060 in which a recessed channel 1062 is formed by machining or the like. The channel serves to confine the fluid upon which a wafer floats as it move along channel 1062 and water track 404. A plurality of fluid jets 416 are in communication with channel 1062 and provide that cushion of fluid. As illustrated in FIG. 4, Isolation slots 1012 extend across the entire width of channel 1062 and act as a spillway collecting all the water from that end of the track and preventing it from flowing onto an adjacent track. Included in the collected water are any of the chemical cleaning agents that escape from the adjacent brush box or that are rinsed from a wafer as it passes along the water track, and any of the particulates or other residue of the cleaning process.

As noted, isolation slots 1012 have a length that extends completely across channel 1062. Each isolation slot preferably has the maximum width (in the direction of wafer travel along the water track) that still allows a wafer to cross the slot unimpeded. Maximizing the width maximizes the amount of fluid that can be drained from the water track. Preferably the slot has a width of about 3–5 mm.

In accordance with a further embodiment of the invention, the scrub modules 409 and 411 are also enclosed in separate containment structures to prevent the escape of contaminated fluids or vapors. Referring now to FIGS. 8 and 13, one of the two containment structures will be described with reference to scrub module 409 including water tracks 404 and 405 and brush box 408. Containment structure 1030 is schematically illustrated in cross section in FIG. 13. Containment structure 1030 consists of a large drain pan 1014 with side walls 1016 extending upwardly and around water tracks 404 and 405 and brush box 408. Slots (not shown) are formed in side walls 1016 to accept the drive shafts for brush box 408. The drain pan catches the water and cleaning fluids from slots 1012 and brush box 408, and directs the fluids out through a fluid drain 1018. The drain pan 1014 also includes a vent 1020 with a vent fan (not shown) for exhausting vapors from the containment structure 1030.

The containment structure further includes a cover 1024 which is preferably hinged along an edge to one of side walls 1016 of drain pan 1014, thereby allowing easy access to brush box 408 for maintenance or removal. As shown, cover 1024 preferably includes a rim portion that nests with and seals to side walls 1016 to inhibit the escape of fluids from the structure 1030. The two part water scrub module track, i.e., scrub module tracks 404 and 405 associated with brush box 408, also serve the purpose of keeping the wafer within the enclosed scrub module, thereby aiding in containing the cleaning fluids during the back and forth motion of the wafer during the scrubbing process. A similar containment structure can be used with scrub module 411. An aperture 1015 in the sealable cover associated with brush box 408 provides for input of wafers into input station 402. A similar aperture in the sealable cover associated with brush box 410 provides for egress of wafers from scrub module track 413 and transfer to the rinse ring.

After exiting brush box 410, a wafer enters the rinsing area of scrub module track 407. The rinsing area includes, preferably, a second spray rinse 1050. Chemical cleaning agents and any remaining contaminants are rinsed from the wafer surfaces by the water track water jets and by the action of spray rinse 1050. In a preferred embodiment, wafers also receive an additional, thorough rinse in rinse ring 412. Generally, rinse ring 412 is configured to receive wafers in a serial manner, thoroughly rinse each wafer with one or more rinsing solutions such as deionized water, and hold each rinsed wafer for retrieval by robot 112, which thereafter transports the rinsed wafer to spin/rinse dryer station 414 (see FIG. 4).

Upon completion of the rinsing operation, wet end-effector 118 of robot 112 retrieves the rinsed wafer and transfers it to spin/rinse dryer station 414. The spin dryer holds the wafer and spins it at approximately 4,000 rpm. During spinning, the wafer is rinsed, preferably by subjecting the wafer surface to a jet of rinse water and by megasonic spraying. In the megasonic spraying, rinse water projected onto the wafer surface is agitated at a high frequency. After rinsing, the wafer is spun for preferably about 20 seconds to remove all water and other particulates from the wafer surfaces. During spinning, the centrifugal forces applied to the wafer removes water droplets from the wafer surfaces. To augment this drying process, an air flow module may be mounted above the wafer to direct a column of forced air across the upper wafer surface.

Once spin drying is complete, dry end-effector 116 of robot 112 removes the wafer from spin dryer station 414 and returns the dried wafer to the slot of the cassette from which the wafer originated.

Load/unload station 100 and cleaning station 400 are preferably maintained in a class 1–10 clean room environment. Hence, the housing of load/unload station 100 and cleaning station 400 should include air tight seals, and positive airflow from load/unload station 100 and cleaning station 400 into index station 200 should be utilized to keep contaminating particles that exist in index and CMP stations 200, 300 from entering the clean room environment.

A touch screen display (not shown) may be employed to allow the operator to monitor, reconfigure, troubleshoot, and otherwise operate machine 20. More particularly, a touch screen display panel may be configured to display, preferably in three dimensions, a graphical representation of the various operational features of machine 20 described above. For example, if the operator desires to load a new cassette into load station 100, the operator may press a graphical icon representative of load station 100 on the touch screen display. The touch screen display may then prompt the operator with questions, or may simply permit the operator to touch the door associated with the cassette loading function to thereby open the door. This model of touch screen interaction may be applied to virtually any aspect of machine 20 described herein.

Instead of utilizing sensors 420 in the water tracks and various processing stations, a vision system could be utilized to track wafers as they travel through cleaning station 400 and to detect when and if errors, delays, wafer breakage, or the like occur during the cleaning process. As with the vision system for mapping the locations of the wafers in the cassettes, the IVS Express vision system from Acuity Imaging Inc. could be utilized to this end.

Although the present invention has been described in conjunction with particular embodiments illustrated in the appended drawing figures, it will be appreciated that the invention is not so limited. Modification may be made in the design and implementation of the subject polishing, cleaning, rinsing and drying system without departing from the spirit and scope of the subject invention as set forth in the claims below.

What is claimed is:

1. Apparatus for cleaning a work piece comprising:
   first and second water tracks for moving a work piece, the second water track positioned adjacent the first water track so that a work piece can move from the first water track to the second water track;
   an isolation slot positioned proximate the end of the first water track to prevent water in the first water track from flowing into the second water track.

2. An apparatus for cleaning a work piece, comprising:
   a brush box comprising a plurality of scrubbing rollers and a plurality of pairs of drive rollers;
   a first drive mechanism coupled to the plurality of scrubbing rollers and capable of causing the scrubbing rollers to rotate in a predetermined rotational direction at a predetermined rotational rate;
   a second drive mechanism coupled to the plurality of pairs of drive rollers and capable of causing the pairs of drive rollers to rotate in second predetermined rotational directions and at second predetermined rotational rates, the drive rollers positioned to rotate against surfaces of the work piece to urge the work piece through the brush box;
   sensors for detecting the position of the work piece relative to the brush box; and
   a controller responsive to signals from the sensors and capable of controlling and changing the second rotational directions of the drive rollers so as to cause the work piece to move in first one direction and then to move in the opposite direction through the brush box.

3. The apparatus of claim 2 further comprising a manifold for dispensing a chemical cleaning agent onto the scrubbing rollers and the work piece.

4. The apparatus of claim 3 further comprising a water track for conveying the work piece to the brush box for cleaning and for conveying the work piece away from the brush box after cleaning.

5. The apparatus of claim 4 further comprising a chemical containment enclosure for collecting the chemical cleaning agent and water from the water track.

6. The apparatus of claim 5 further comprising an isolation slot provided at an extremity of the water track through which the chemical cleaning agent and the water flow into the chemical containment enclosure.

7. An apparatus for cleaning a semiconductor wafer with cleaning chemicals, comprising:
   a brush box in which cleaning chemicals can be dispensed onto a semiconductor wafer;
   a first water track for transporting the semiconductor wafer into the brush box;
   a second water track for transporting the semiconductor wafer away from the brush box;
   a drain pan beneath the first and second water tracks and the brush box for collecting the cleaning chemicals, the drain pan having sidewalls; and
   a removable cover covering the water tracks and the brush box, the cover comprising a rim portion for sealingly engaging the drain pan sidewalls.

8. The apparatus of claim 7, further comprising a first aperture in the removable cover allowing for loading of the wafer into the first water track.

9. The apparatus of claim 7, further comprising an isolation slot at an extremity of the second water track through which water from the second water track and the cleaning chemicals flow to the drain pan.

10. The apparatus of claim 9 further comprising a third water track positioned adjacent the second water track for conveying the wafer to a subsequent processing area.

11. The apparatus of claim 10, wherein the isolation slot extends completely across the second water track.

12. The apparatus of claim 11 wherein the isolation slot has a width selected to prevent the flow of water and cleaning chemicals from the second water track to the third water track, but allowing the passage of the wafer from the second water track to the third water track.

13. The apparatus of claim 12 further comprising a first plurality of drive rollers for moving the work piece through the first brush box and a second plurality of drive rollers for moving the work piece through the second brush box.

14. The apparatus of claim 13 further comprising:
   a first controller coupled to the first plurality of drive rollers and capable of controlling the rotational direction thereof and thereby to control the direction the work piece moves through the first brush box and allowing the work piece to move through the first brush box in first one direction and then in the opposite direction.

15. The apparatus of claim 13 further comprising:
   a second controller coupled to the second plurality of drive rollers and capable of controlling the rotational direction thereof and to control the direction the work piece moves through the second brush box and allowing the work piece to move through the second brush box in first one direction and then in the opposite direction.

16. Apparatus for cleaning a work piece comprising:
   a first brush box including a mechanism for dispensing a first chemical onto the work piece;
   a second brush box including a mechanism for dispensing a second chemical onto the work piece;
   a first water track for moving the work piece into and out of the first brush box;
   a second water track for moving the work piece into and out of the second brush box;
   a third water track for transferring a work piece from the first water track to the second water track, each of the first, second, and third water tracks including a plurality of water nozzles for moving the work piece;
   a first isolation slot in the first water track to prevent the first chemical from entering the third water track; and
   a second isolation slot in the second water track to prevent the second chemical from entering the third water track.

17. The apparatus of claim 16 further comprising a first chemical containment enclosure for collecting the first chemical from the first brush box and the first water track.

18. The apparatus of claim 17 wherein the first isolation slot provides an entrance for the first chemical to enter the first chemical containment enclosure.

19. The apparatus of claim 17 further comprising a second chemical containment enclosure for collecting the second chemical from the second brush box and the second water track.

20. The apparatus of claim 19 wherein the second isolation slot provides an entrance for the second chemical to enter the second chemical containment enclosure.

21. Apparatus for cleaning a work piece comprising:

a first cleaning station for cleaning the work piece in a first cleaning agent;

a second cleaning station for cleaning the work piece in a second cleaning agent different from the first cleaning agent;

a first water track configured to transport the work piece away from the first cleaning station;

a second water track configured to transport the work piece to the second cleaning station; and an isolation area configured to maintain the first cleaning agent in separation from the second cleaning agent.

* * * * *